(12) United States Patent
Sato et al.

(10) Patent No.: US 9,153,608 B2
(45) Date of Patent: Oct. 6, 2015

(54) PHOTODIODE ARRAY, METHOD FOR DETERMINING REFERENCE VOLTAGE, AND METHOD FOR DETERMINING RECOMMENDED OPERATING VOLTAGE

(75) Inventors: Kenichi Sato, Hamamatsu (JP); Shogo Kamakura, Hamamatsu (JP); Shigeyuki Nakamura, Hamamatsu (JP); Tsuyoshi Ohta, Hamamatsu (JP); Michito Hirayanagi, Hamamatsu (JP); Hiroki Suzuki, Hamamatsu (JP); Shunsuke Adachi, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 497 days.

(21) Appl. No.: 13/247,192

(22) Filed: Sep. 28, 2011

(65) Prior Publication Data

US 2013/0009266 A1    Jan. 10, 2013

(30) Foreign Application Priority Data

Jul. 4, 2011 (JP) ................................ P2011-148308

(51) Int. Cl.
 *H01J 40/14*  (2006.01)
 *H01F 3/08*   (2006.01)
 *H03K 17/78*  (2006.01)
 *H01L 27/00*  (2006.01)
 (Continued)

(52) U.S. Cl.
 CPC .................................. *H01L 27/1446* (2013.01)

(58) Field of Classification Search
 CPC .. H03K 17/0416; H03K 17/74; H01L 31/107; H01L 29/66113; H01L 29/7313; H01L 29/7886; H01L 31/02027

USPC ...... 250/214.1, 214 R, 214 DC, 208.1, 208.2, 250/214 VT, 207
See application file for complete search history.

(56) References Cited

U.S. PATENT DOCUMENTS 2,712,081 A  *  6/1955  Fearon et al. ............... 250/269.4
3,577,125 A  *  5/1971  Frisbie ......................... 340/2.21
(Continued)

FOREIGN PATENT DOCUMENTS

CN  1560577  1/2005
CN  101484999  7/2009
(Continued)

OTHER PUBLICATIONS

Christopher J. Stapels et al., "Characterization of a CMOS Geiger Photodiode Pixel," IEEE Transactions on Electron Devices, vol. 53, No. 4, Apr. 2006, pp. 631-635.

(Continued)

*Primary Examiner* — Patrick Assouad
*Assistant Examiner* — Hoang X Nguyen
(74) *Attorney, Agent, or Firm* — Drinker Biddle & Reath LLP

(57) ABSTRACT

A reverse bias voltage is applied to a photodiode array provided with a plurality of avalanche photodiodes operated in Geiger mode and with quenching resistors connected in series to the respective avalanche photodiodes. Electric current is measured with change of the reverse bias voltage applied, and the reverse bias voltage at an inflection point in change of electric current measured is determined as a reference voltage. A voltage obtained by adding a predetermined value to the determined reference voltage is determined as a recommended operating voltage.

7 Claims, 5 Drawing Sheets

(51) Int. Cl.
*H01J 31/50* (2006.01)
*H01L 27/144* (2006.01)

(56) References Cited

U.S. PATENT DOCUMENTS

| | | | | |
|---|---|---|---|---|
| 4,493,745 | A * | 1/1985 | Chen et al. | 438/9 |
| 5,532,474 | A * | 7/1996 | Dautet et al. | 250/214 R |
| 5,548,112 | A * | 8/1996 | Nakase et al. | 250/214 C |
| 5,721,424 | A * | 2/1998 | Price | 250/214 R |
| 5,929,982 | A * | 7/1999 | Anderson | 356/73.1 |
| 5,953,690 | A * | 9/1999 | Lemon et al. | 702/191 |
| 6,649,075 | B1 * | 11/2003 | Buie et al. | 216/59 |
| 6,858,829 | B2 * | 2/2005 | Nishimura et al. | 250/214 R |
| 7,103,288 | B2 * | 9/2006 | Wang | 398/212 |
| 7,501,628 | B2 * | 3/2009 | Charbon et al. | 250/338.4 |
| 7,547,872 | B2 * | 6/2009 | Niclass et al. | 250/214 R |
| 7,626,389 | B2 * | 12/2009 | Fiedler et al. | 324/309 |
| 7,683,308 | B2 * | 3/2010 | Charbon et al. | 250/214 R |
| 7,800,070 | B2 * | 9/2010 | Weinberg et al. | 250/363.03 |
| 7,897,906 | B2 * | 3/2011 | Deschamps | 250/214 R |
| 8,168,934 | B2 * | 5/2012 | Niclass et al. | 250/214 R |
| 2002/0191261 | A1 * | 12/2002 | Notargiacomo et al. | 359/181 |
| 2002/0195545 | A1 | 12/2002 | Nishimura et al. | |
| 2003/0030951 | A1 * | 2/2003 | Green | 361/56 |
| 2004/0245592 | A1 * | 12/2004 | Harmon et al. | 257/438 |
| 2005/0224697 | A1 * | 10/2005 | Nishiyama | 250/214 A |
| 2006/0255245 | A1 * | 11/2006 | Ichino | 250/214 R |
| 2007/0029485 | A1 * | 2/2007 | Beck et al. | 250/338.4 |
| 2007/0057160 | A1 * | 3/2007 | Kaku et al. | 250/214 R |
| 2007/0222678 | A1 * | 9/2007 | Ishio et al. | 342/372 |
| 2008/0231339 | A1 | 9/2008 | Deschamps | |
| 2010/0148040 | A1 * | 6/2010 | Sanfilippo et al. | 250/214.1 |
| 2010/0271108 | A1 * | 10/2010 | Sanfilippo et al. | 327/502 |
| 2012/0091325 | A1 * | 4/2012 | Sears et al. | 250/214 R |

FOREIGN PATENT DOCUMENTS

| | | |
|---|---|---|
| JP | H7-020196 | 1/1995 |
| JP | 2010-536186 | 11/2010 |
| JP | 2011-3739 | 1/2011 |
| JP | 2011-003740 | 1/2011 |
| RU | 2102821 C1 | 1/1998 |
| RU | 2339973 C2 | 11/2008 |
| WO | WO 2008/004547 | 1/2008 |
| WO | WO 2008/004597 | 1/2008 |
| WO | WO 2008/121072 | 10/2008 |
| WO | WO 2010/098225 | 9/2010 |

OTHER PUBLICATIONS

Hamamatsu Photonics K.K. Technical Information; "MPPC® Multi-Pixel Photon Counter," May 2009.

* cited by examiner (a)

(b)

PHOTODIODE ARRAY, METHOD FOR DETERMINING REFERENCE VOLTAGE, AND METHOD FOR DETERMINING RECOMMENDED OPERATING VOLTAGE

BACKGROUND OF THE INVENTION

1. Field of the Invention

The present invention relates to a photodiode array, a recommended operating voltage determining method for determining a recommended operating voltage of a reverse bias voltage to be applied to the photodiode array, and a reference voltage determining method for determining a reference voltage for determination of the recommended operating voltage.

2. Related Background Art

There is a known photodiode array provided with a plurality of avalanche photodiodes operated in Geiger mode and quenching resistors connected in series to the respective avalanche photodiodes (e.g., cf. Japanese Patent Application Laid-open No. 2011-003739). The photodiode array of this kind is used as an opto-semiconductor device for photon counting "MPPC" (registered trademark), as also described in Japanese Patent Application Laid-open No. 2011-003739.

SUMMARY OF THE INVENTION

For the foregoing photodiode array, as described in "MPPC (registered trademark) Multi-Pixel Photon Counter, Technical Information (May 2009), Hamamatsu Photonics K.K.," the recommended operating voltage of the reverse bias voltage to be applied to the photodiode array is determined so as to obtain a desired gain (multiplication factor). In general, the recommended operating voltage is determined by the technique described below.

The foregoing multiplication factor of the photodiode array can be calculated from an output charge amount upon detection of photons by the photodiode array. This multiplication factor varies depending upon the reverse bias voltage applied to the photodiode array. Therefore, the reverse bias voltage is found at a desired value of the multiplication factor calculated from the output charge amount and this reverse bias voltage is determined as the recommended operating voltage.

Incidentally, the multiplication factor is measured as described below. An amplifier (e.g., a charge amplifier or the like) is connected to the foregoing photodiode array and a frequency distribution of output charge amounts is obtained from outputs of the amplifier. The frequency distribution of output charge amounts is obtained by plotting a distribution of accumulated charge amounts per unit time. A plurality of separate peaks appear in the frequency distribution of output charge amounts and a space between adjacent peaks corresponds to an output charge amount of detection of one photon. For this reason, the multiplication factor can be calculated based on the space between adjacent peaks.

However, the above-described multiplication factor measuring technique has the problem as described below.

Since the foregoing photodiode array is a solid-state device, noise due to carriers of thermally generated dark current (dark noise) is generated. Particularly, in the foregoing photodiode array, the dark noise is multiplied and generated at random, which makes discrimination difficult between the dark noise and a photon detection signal. Namely, it is difficult to discriminate the occurrence frequency of dark noise (dark count) from the frequency of detection of a predetermined number of photons. For this reason, the separate peaks become less likely to appear in the frequency distribution of output charge amounts, and it is thus difficult to calculate the multiplication factor itself. Particularly, when the photodiode array is constructed in a large area, the dark count increases, so as to make the problem of difficulty in measurement of the multiplication factor more significant.

The amplifier is connected to the photodiode array to amplify the output from the photodiode array. For this reason, the measurement result is significantly affected by characteristic variation of the amplifier, which makes it difficult to accurately calculate the multiplication factor.

In the above-described recommended operating voltage determining method, therefore, since the recommended operating voltage is determined based on the multiplication factor calculated from output charge amounts, it is difficult to accurately and readily determine the recommended operating voltage.

It is therefore an object of the present invention to provide a reference voltage determining method and a recommended operating voltage determining method capable of readily and accurately determining a recommended operating voltage of a reverse bias voltage to be applied to a photodiode array, and a reference voltage for determination of the recommended operating voltage, and a photodiode array for which a multiplication factor determined based on the recommended operating voltage is set.

The inventors conducted research study and discovered the new fact as described below.

When the reverse bias voltage is applied to a photodiode array comprising an array of a plurality of avalanche photodiodes operated in Geiger mode and quenching resistors electrically connected at their one ends to the respective avalanche photodiodes and the reverse bias voltage is varied, its current-voltage characteristic varies as follows. Namely, after the reverse bias voltage becomes over the breakdown voltage, the avalanche photodiodes come to move into a Geiger region; as the avalanche photodiodes start moving into the Geiger mode, the current value comes to rise. Then an inflection point appears in change of current against reverse bias voltage, at the reverse bias voltage at which the largest number of avalanche photodiodes go into the Geiger mode. These are caused by the configuration wherein the plurality of avalanche photodiodes are connected in parallel and the configuration wherein the quenching resistors are connected in series to the respective avalanche photodiodes. Therefore, a reference voltage can be determined to be the reverse bias voltage at this inflection point and the recommended operating voltage can be set based on the reference voltage, whereby the recommended operating voltage can be readily and accurately determined.

In the light of this fact, an aspect of the present invention is a reference voltage determining method for determining a reference voltage for determination of a recommended operating voltage of a reverse bias voltage to be applied to a photodiode array comprising a plurality of avalanche photodiodes operated in Geiger mode and quenching resistors connected in series to the respective avalanche photodiodes, the method comprising: measuring electric current with change of the reverse bias voltage applied to the photodiode array, and determining the reverse bias voltage at an inflection point in change of the electric current measured, as the reference voltage.

In the reference voltage determining method according to the present invention, the reverse bias voltage at the inflection point in change of the electric current measured is determined as the reference voltage. This allows us to accurately determine the reference voltage, with little influence of dark noise. In the present invention, the reverse bias voltage is applied and the change of electric current against change of the reverse bias voltage is measured, to obtain the inflection point of the change. For this reason, the reference voltage can be readily determined.

The reverse bias voltage at a peak of the first-order derivative of the measured electric current may be determined as the reference voltage. Furthermore, the reverse bias voltage at a zero of the second-order derivative of the measured electric current may be determined as the reference voltage. In either case, the inflection point in change of the electric current can be surely determined.

Incidentally, the multiplication factor M of the photodiode array is expressed by the following formula.

$$M = C \times \Delta V$$

C is a junction capacitance of each avalanche photodiode. $\Delta V$ is a potential difference from the reverse bias voltage at which the largest number of avalanche photodiodes move into the Geiger mode, i.e., from the reference voltage. Therefore, once the difference between the recommended operating voltage and the reference voltage is determined, the multiplication factor M is uniquely determined. Inversely, a desired multiplication factor M can be achieved by adding $\Delta V$ satisfying the above formula, to the reference voltage.

Another aspect of the present invention is a recommended operating voltage determining method for determining a recommended operating voltage of a reverse bias voltage to be applied to a photodiode array comprising a plurality of avalanche photodiodes operated in Geiger mode and quenching resistors connected in series to the respective avalanche photodiodes, the method comprising: determining a voltage obtained by adding a predetermined value to the reference voltage determined by the reference voltage determining method as defined above, as the recommended operating voltage.

In the recommended operating voltage determining method according to the present invention, the voltage obtained by adding the predetermined value to the reference voltage determined by the foregoing reference voltage determining method is determined as the recommended operating voltage. This allows us to accurately determine the recommended operating voltage, with little influence of dark noise, and to readily determine the recommended operating voltage.

The inventors conducted research study and also discovered the new fact as described below.

In the current-voltage characteristic, the inflection point appears in change of the electric current, at the reverse bias voltage at which the largest number of avalanche photodiodes move into the Geiger mode. With further increase of the reverse bias voltage, there is a region where the electric current exponentially increases because of influence of afterpulse and others. At this point, a new inflection point appears. These inflection points are inflection points of variation from a downwardly convex state to an upwardly convex state, with increase of the reverse bias voltage. Therefore, the reverse bias voltage in a curve portion between the two inflection points in the change of current against reverse bias voltage may be set as the recommended operating voltage, whereby the recommended operating voltage can be readily and accurately determined.

In the light of the above fact, another aspect of the present invention is a recommended operating voltage determining method for determining a recommended operating voltage of a reverse bias voltage to be applied to a photodiode array comprising a plurality of avalanche photodiodes operated in Geiger mode and quenching resistors connected in series to the respective avalanche photodiodes, the method comprising: measuring electric current with change of the reverse bias voltage applied to the photodiode array, and determining the reverse bias voltage in a curve portion between two inflection points of variation from a downwardly convex state to an upwardly convex state, in the change of electric current measured, as the recommended operating voltage.

In the recommended operating voltage determining method according to the present invention, the reverse bias voltage in the curve portion between the two inflection points of variation from the downwardly convex state to the upwardly convex state in the change of electric current measured is determined as the recommended operating voltage. This permits us to accurately determine the recommended operating voltage, with little influence of dark noise, and to readily determine the recommended operating voltage.

Another aspect of the present invention is a photodiode array comprising a plurality of avalanche photodiodes operated in Geiger mode, and quenching resistors connected in series to the respective avalanche photodiodes, wherein a multiplication factor is set based on the recommended operating voltage determined by the recommended operating voltage determining method as described above.

In the photodiode array according to the present invention, since the multiplication factor is set based on the recommended operating voltage accurately determined, it is feasible to suppress variation in multiplication factor.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference signs, without redundant description.

Figure 1:
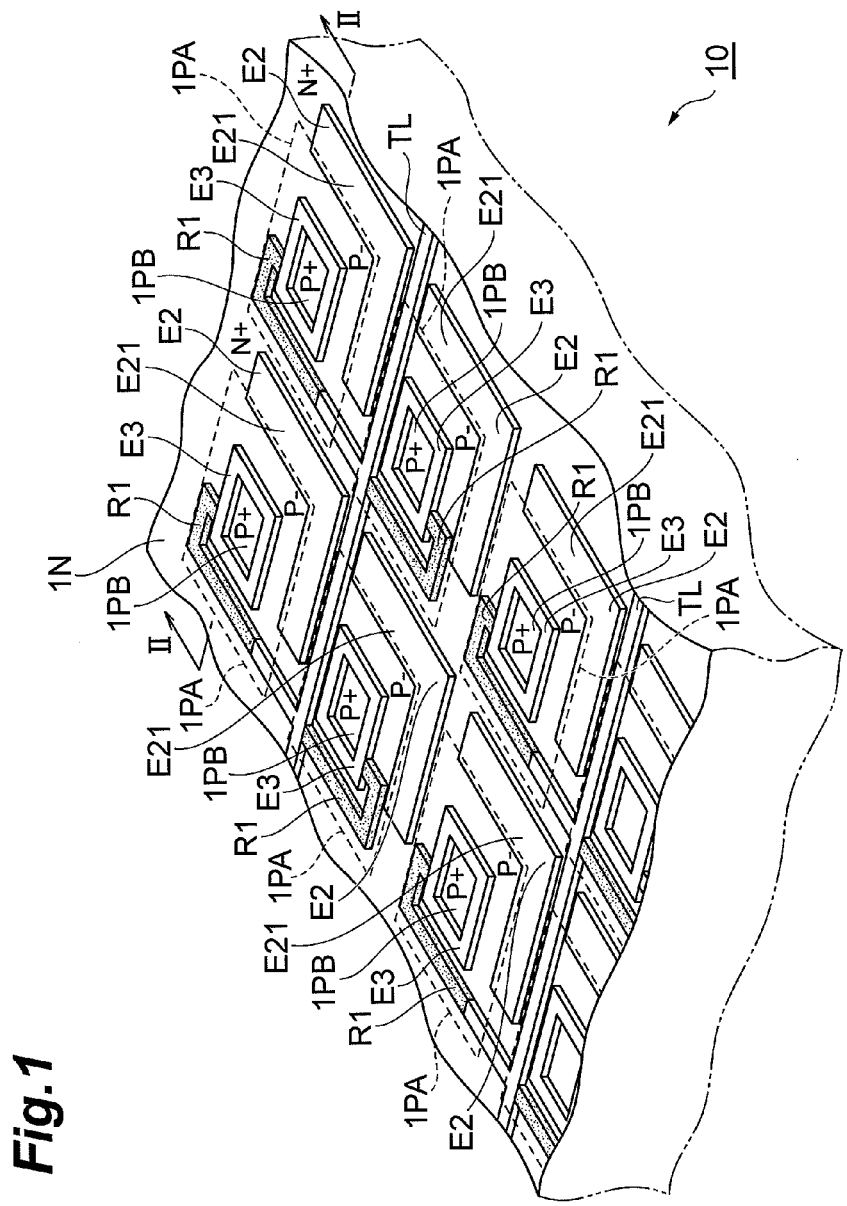
FIG. 1 is a perspective view of a photodiode array according to an embodiment of the present invention.
Figure 2:
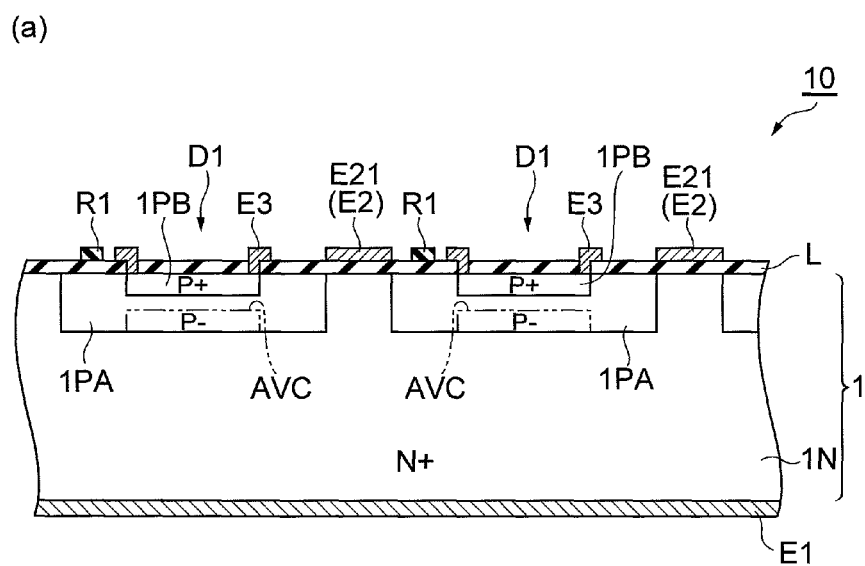
FIG. 2 is (a) a cross-sectional view along the line II-II of the photodiode array shown in FIG. 1, and (b) a circuit diagram thereof.
Figure 2:
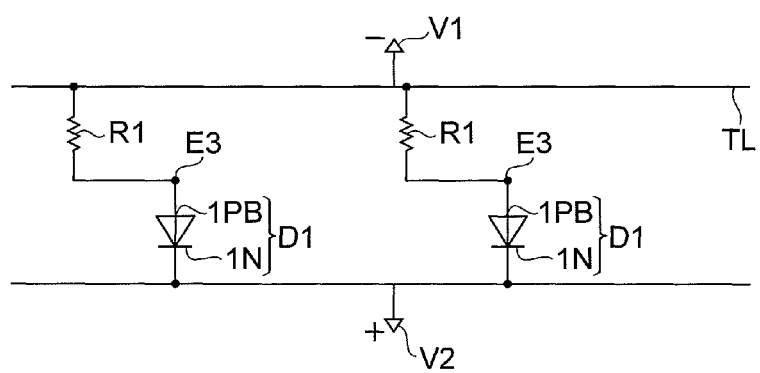
Figure 3:
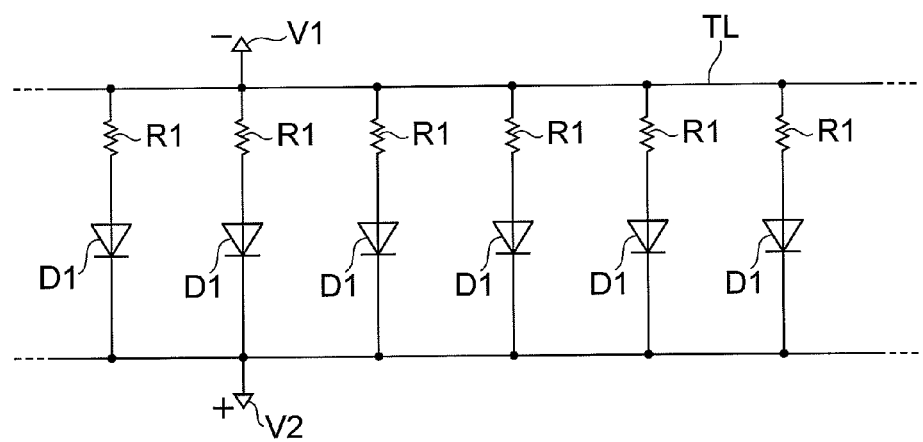
FIG. 3 is a circuit diagram of the overall photodiode array according to the embodiment of the present invention.

First, a configuration of a photodiode array according to an embodiment of the present invention will be described with reference to FIGS. 1 to 3. FIG. 1 is a perspective view of the photodiode array, and FIG. 2 is (a) a cross-sectional view along the line II-II of the photodiode array shown in FIG. 1, and (b) a circuit diagram thereof. FIG. 3 is a circuit diagram of the whole photodiode array.

In the photodiode array 10, a plurality of photodiodes D1 (cf. FIG. 3) are formed in an n-type (first conductivity type) semiconductor substrate 1N.

Each photodiode D1 has a p-type (second conductivity type) first semiconductor region 1PA formed on one surface side of the semiconductor substrate 1N, and a p-type (second conductivity type) second semiconductor region 1PB formed in the first semiconductor region 1PA. The second semiconductor region 1PB has an impurity concentration higher than the first semiconductor region 1PA. The photodiode D1 has a first electrode E1 electrically connected to the semiconductor substrate 1N, and a surface electrode E3 formed on the second semiconductor region 1PB. The planar shape of the first semiconductor region 1PA is quadrilateral. The second semiconductor region 1PB is located inside the first semiconductor region and the planar shape thereof is quadrilateral. The depth of the first semiconductor region 1PA is larger than that of the second semiconductor region 1PB. The semiconductor substrate 1 in FIG. 1 represents one including the n-type semiconductor substrate 1N and both of the p-type semiconductor regions 1PA, 1PB.

In the photodiode array 10, each photodiode D1 is provided with a first reflector E2 comprised of a metal layer, and a resistive layer (quenching resistor) R1. The first reflector E2 is formed through an insulating layer L (cf. FIG. 2) on the semiconductor substrate 1N outside the first semiconductor region 1PA. The resistive layer R1 has one end continuous to the surface electrode E3 and extends along the surface of the insulating layer L on the first semiconductor region 1PA. In FIG. 1, the illustration of the insulating layer L shown in FIG. 2 is omitted for clarity of structure.

The first reflector E2 consists of a reflector E21 comprised of a metal layer of an L-planar shape. The first reflector E21 (E2) located on the semiconductor substrate 1N is electrically isolated from the ring-like surface electrode E3 having a first aperture. Namely, the photodiode D1 is provided with the respective electrodes as anode and cathode, and the surface electrode E3 is electrically separated from the first reflector E2. This configuration clearly discriminates the first reflector E2 from the surface electrode E3, which increases degrees of freedom for design to arrange the reflector at a location suitable for reflection. The other end of the resistive layer R1 connected to each photodiode D1 is electrically connected through a wiring electrode continuous to the resistive layer R1, if needed, to a common signal readout line TL.

In FIG. 1, a pair of photodiodes (regions immediately below the semiconductor regions 1PA) adjacent in the column direction both are connected each through the resistive layer R1 to a signal readout line TL extending in the row direction. Plural pairs of photodiodes are connected each through the resistive layer R1 to one signal readout line TL. A plurality of signal lines TL extending in the row direction are arranged along the column direction. Plural pairs of photodiodes are also similarly connected each through the resistive layer R1 to each signal line TL. The signal lines TL shown in FIG. 1 all are connected to each other eventually to serve as a single signal line TL in terms of circuitry in the circuit as shown in FIG. 3.

The resistive layer R1 has the resistivity higher than the surface electrode E3 connected thereto and higher than the first reflector E2. Specifically, the resistive layer R1 is comprised of polysilicon, while the other electrodes and reflector all are comprised of metal such as aluminum. When the semiconductor substrate 1 is comprised of Si, for example, AuGe/Ni is also often used besides aluminum as electrode material. In the case of Si being used, a p-type impurity to be used is a Group III element such as B, and an n-type impurity to be used is a Group V element such as N, P, or As. Even if a device is constructed by interchanging the conductivity types of n-type and p-type of the semiconductors, the device can function. These impurities can be added by a method such as diffusion or ion implantation.

A material of the insulating layer L to be used can be $SiO_2$ or SiN. When the insulating layer L is comprised, for example, of $SiO_2$, the insulating layer L can be formed by a method such as thermal oxidation or sputtering.

In the case of the above-described structure, a pn junction is formed between the n-type semiconductor substrate 1N and the p-type first semiconductor region 1PA, thereby forming the photodiode D1. The semiconductor substrate 1N is electrically connected to the first electrode E1 formed on the back surface of the substrate. The first semiconductor region 1PA is connected through the second semiconductor region 1 PB to the surface electrode E3. The resistive layer R1 is connected in series to the photodiode D1 (cf. (b) of FIG. 2).

In the photodiode array 10, each photodiode D1 is operated in Geiger mode. In the Geiger mode, a reverse voltage (reverse bias voltage) larger than the breakdown voltage of the photodiode D1 is applied between the anode and cathode of the photodiode D1. Namely, a (−) potential V1 is applied to the anode, while a (+) potential V2 is applied to the cathode. The polarities of these potentials are relative ones, and it is also possible to set one potential to the ground potential.

The anode is the p-type semiconductor region 1PA and the cathode the n-type semiconductor substrate 1N. Each photodiode D1 functions as an avalanche photodiode. When light (photon) is incident into the photodiode D1, it is photoelectrically converted inside the substrate to generate a photoelectron. Avalanche multiplication occurs in an avalanche region AVC near the pn junction interface in the p-type semiconductor region 1PA shown in (a) of FIG. 2, and an electron group resulting from the multiplication flows toward the electrode E1.

The first reflector E2 is provided on the surface of the semiconductor substrate 1N outside the first semiconductor region 1PA having the relatively lower impurity concentration than the second semiconductor region 1PB. The region of the exposed surface of the semiconductor substrate 1N is a dead space that rarely contributes to detection, with light incidence. The first reflector E2 reflects incident light toward a second reflector (e.g., an internal surface of a metal package or the like). The second reflector again reflects the incident light to guide the re-reflected light effectively to the photodiodes D1.

The other end of the resistive layer R1 connected to each photodiode D1 is electrically connected to the common signal readout line TL along the surface of the semiconductor substrate 1N. The plurality of photodiodes D1 are operated in Geiger mode and each photodiode D1 is connected to the common signal line TL. For this reason, when photons are incident simultaneously to a plurality of photodiodes D1, outputs of the photodiodes D1 all are fed to the common signal line TL to be measured as a signal with high intensity according to the number of incident photons as a whole. A load resistor to cause a voltage drop for signal readout may be connected to the signal readout line TL.

The above-described structure is the structure of the front illuminated type photodiode array, but it is also possible to adopt a structure of a back illuminated type photodiode array. In this case, the semiconductor substrate 1N is thinned and the back electrode E1 is made as a transparent electrode. The back electrode E1 may be located at another position of the semiconductor substrate 1N (e.g., on the front surface side of the substrate).

Figure 4:
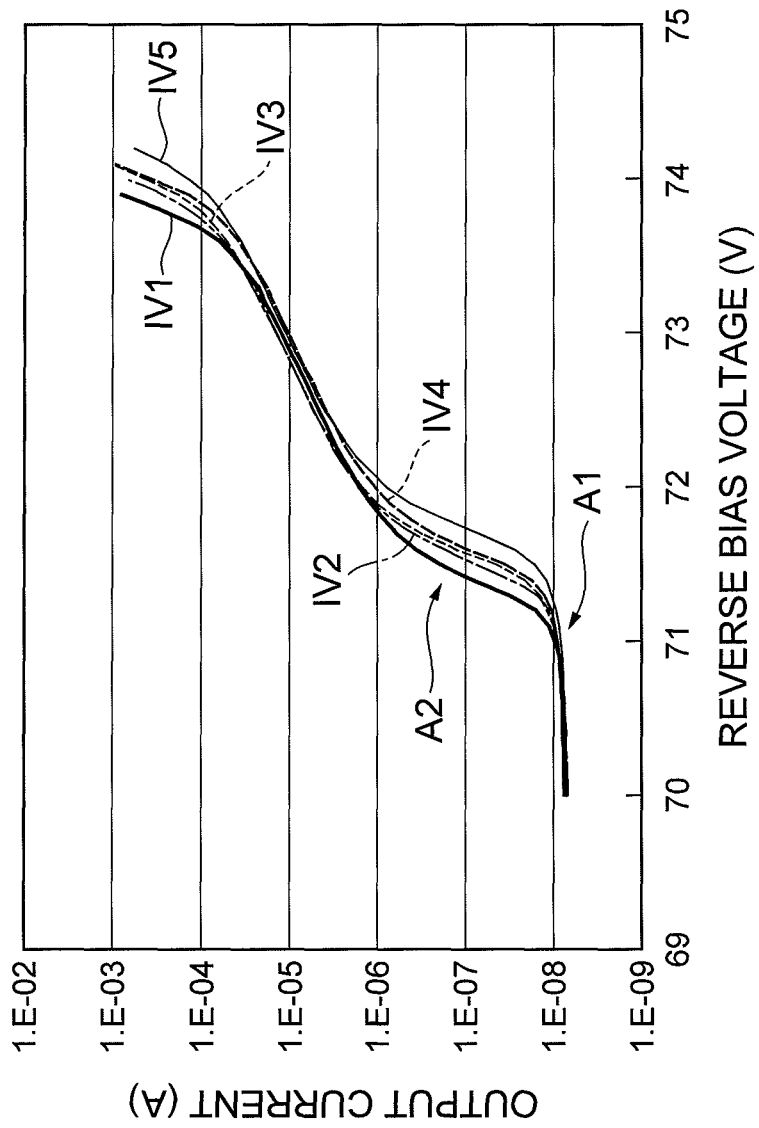
FIG. 4 is a graph showing changes of electric current against reverse bias voltage.
Figure 5:
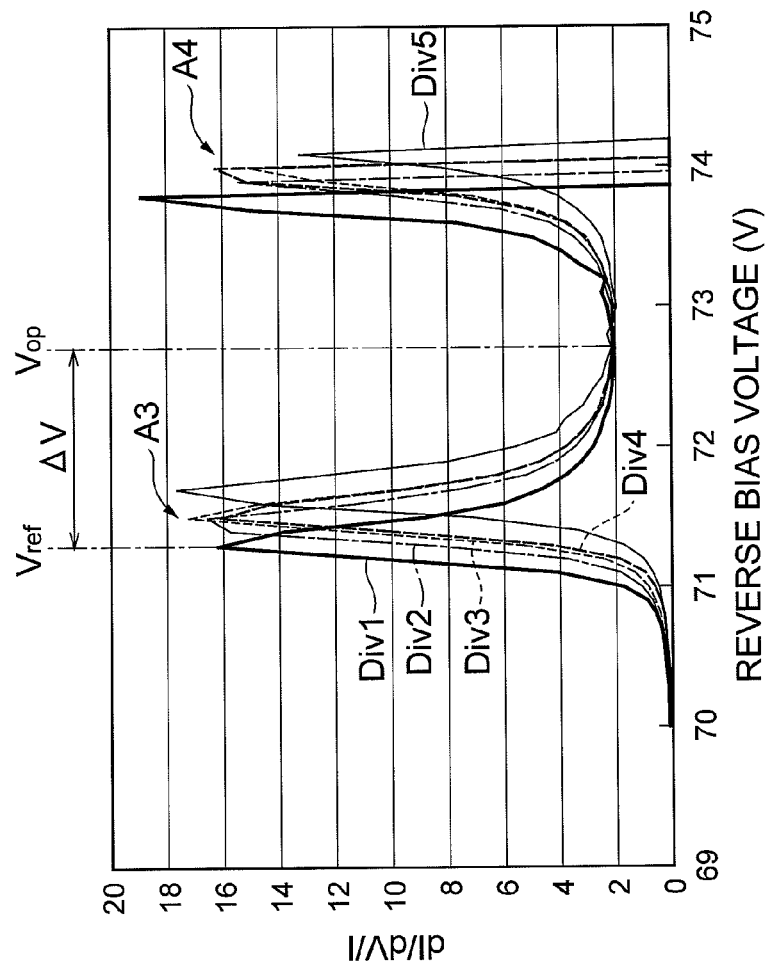
FIG. 5 is a graph showing the result of the first-order derivative of the current-voltage characteristics shown in FIG. 4, with respect to current.

The below will describe a reference voltage determining method, a recommended operating voltage determining method, and a multiplication factor setting method of the photodiode array 10, with reference to FIGS. 4 and 5. FIG. 4 is a graph showing changes of electric current against reverse bias voltage. FIG. 5 is a graph showing the result of the first-order derivative of the current-voltage characteristics shown in FIG. 4, with respect to current.

First, the reverse bias voltage is applied to the photodiode array 10. Then its output current is measured with change of reverse bias voltage. Namely, the current-voltage characteristic of the photodiode array 10 is measured. At this time, an amplifier such as a charge amplifier does not always have to be connected to the photodiode array 10. In order to eliminate influence of characteristic variation of the amplifier, it is preferable to connect no amplifier to the photodiode array 10. Input current to the photodiode array 10 may be measured instead of the output current.

In the photodiode array 10, the reverse bias voltage at entry into the Geiger region can be preliminarily estimated. Therefore, the lower limit in change of reverse bias voltage does not have to be set to zero, but may be set to a voltage lower by a predetermined value than the reverse bias voltage at entry into the Geiger region. This can decrease the time for measurement of the output current of the photodiode array 10.

An example of the measurement result is shown in FIG. 4. FIG. 4 shows the measurement result of each of five photodiode arrays 10. As seen from FIG. 4, the photodiode arrays 10 have their respective current-voltage characteristics IV1-IV5 different from each other. Therefore, it is necessary to set the multiplication factor for each photodiode array 10.

As seen from each of the current-voltage characteristics IV1-IV5 shown in FIG. 4, each of the photodiode arrays 10 moves into the Geiger region after the reverse bias voltage becomes over the breakdown voltage; as the photodiodes D1 start to move into Geiger mode, the output current value comes to rise (at the part indicated by arrow A1 in FIG. 4). The reverse bias voltage values at the rise of output current are different among the photodiode arrays 10.

With increase of reverse bias voltage, the number of photodiodes D1 moving into the Geiger mode increases, while the output current increases. Then each current-voltage characteristic IV1-IV5 comes to have an inflection point in change of output current at the reverse bias voltage at which the largest number of photodiodes D1 move into the Geiger mode (or at the part indicated by arrow A2 in FIG. 4). Therefore, a reference voltage can be set to the reverse bias voltage at the inflection point of each current-voltage characteristic IV1-IV5, and a recommended operating voltage can be set based on the reference voltage, whereby the recommended operating voltage can be readily and accurately determined.

For obtaining the inflection point in change of output current against reverse bias voltage, each current-voltage characteristic IV1-IV5 shown in FIG. 4 is differentiated with respect to output current. The result is shown in FIG. 5. In this case, each current-voltage characteristic IV1-IV5 is differentiated once with respect to output current. For normalization, values of the first-order derivative are divided by output current.

As seen from the differential characteristics Div1 to Div5 shown in FIG. 5, each inflection point in change of output current against reverse bias voltage appears as a peak of the first-order derivative of output current (at the part indicated by arrow A3 in FIG. 5). The reverse bias voltage at the inflection point is the reverse bias voltage at which the largest number of photodiodes D1 move into the Geiger mode. Therefore, the reverse bias voltage at which the largest number of photodiodes D1 move into the Geiger mode is defined as a reference voltage for determining the recommended operating voltage. The reference voltage varies depending upon the photodiode arrays 10.

In each of the differential characteristics Div1 to Div5 shown in FIG. 5, another peak appears after the first peak of the first-order derivative of output current (at the part indicated by arrow A4 in FIG. 5). This is the result of significant increase of afterpulse and others with increase of reverse bias voltage. Namely, in change of output current against reverse bias voltage, there appears the inflection point caused by the significant increase in output current due to influence of afterpulse and others, in addition to the inflection point caused by transition of the largest number of photodiodes D1 into the Geiger mode. These inflection points are inflection points of variation from a downwardly convex state to an upwardly convex state, with increase of reverse bias voltage. Accordingly, the recommended operating voltage is preferably set in the range of not less than the reverse bias voltage (reference voltage) at which the largest number of photodiodes D1 move into the Geiger mode, and less than the reverse bias voltage at which the afterpulse and others start to significantly increase; i.e., the recommended operating voltage is preferably set to a reverse bias voltage between the aforementioned two inflection points.

Subsequently, the recommended operating voltage for achieving a desired multiplication factor is determined. The multiplication factor M of the photodiode array 10 is represented by $M=C\times\Delta V$, as described above. Since C is the junction capacitance of photodiode D1, it is a known quantity. Therefore, once $\Delta V$ is determined, the multiplication factor M is uniquely determined. Specifically, the reverse bias voltage resulting from addition of $\Delta V$ to the reference voltage is determined as the recommended operating voltage, thereby obtaining the desired multiplication factor M.

For example, a predetermined value is added to the reverse bias voltage (reference voltage) at the peak of each differential characteristic Div1 to Div5 shown in FIG. 5, whereby the reverse bias voltage at the bottom of the downwardly convex curve portion in each differential characteristic Div1 to Div5 is determined as the recommended operating voltage. As a specific example, FIG. 5 shows, for the differential characteristic Div1, the reference voltage $V_{ref}$ at a peak, and the recommended operating voltage $V_{op}$ resulting from addition of the predetermined value $\Delta V$ to the reference voltage $V_{ref}$. The recommended operating voltage differs depending upon the photodiode arrays 10. However, since each photodiode array 10 has the same difference $\Delta V$ between the recommended operating voltage and the reference voltage, each photodiode array 10 can have the same multiplication factor M.

If the recommended operating voltage is set higher than the reverse bias voltage at the bottom of the downwardly convex curve portion in each differential characteristic Div1 to Div5 shown in FIG. 5, the multiplication factor M will increase, so as to provide advantages of high Photon Detection Efficiency (PDE) and improvement in time resolution. On the other hand, it will lead to disadvantages of increase in dark count, crosstalk, and afterpulse. If the recommended operating voltage is set lower than the reverse bias voltage at the bottom of the downwardly convex curve portion in each differential characteristic Div1 to Div5 shown in FIG. 5, the multiplication factor M will decrease, so as to provide advantages of decrease in dark count, crosstalk, and afterpulse. On the other hand, it will lead to disadvantages of low PDE and degradation of time resolution. Therefore, the predetermined value to be added to the reference voltage is to be determined in view of required characteristics of the photodiode array 10.

In the present embodiment, as described above, the reverse bias voltage at the inflection point in change of output current measured is determined as the reference voltage and the voltage resulting from addition of the predetermined value to the reference voltage is determined as the recommended operating voltage. This allows us to accurately determine the reference voltage and the recommended operating voltage, with little influence of dark noise. In the present embodiment, the change of output current against change of reverse bias voltage is measured with application of the reverse bias voltage, to obtain the inflection point of the change. For this reason, the reference voltage and the recommended operating voltage can be readily determined.

In the present embodiment, the multiplication factor M is set based on the recommended operating voltage thus determined accurately. Therefore, it is feasible to suppress variation of the multiplication factor M among photodiode arrays 10.

In the present embodiment, the reverse bias voltage at the peak of the first-order derivative of output current measured is determined as the reference voltage. This allows us to surely determine the inflection point in change of output current.

The aforementioned conventional method for determining the recommended operating voltage requires appropriate detection of light from a light source. For this reason, it is necessary to adopt a configuration for preventing light (ambient light) except for the light from the light source from entering the photodiode array, e.g., a configuration wherein the photodiode array is placed in a dark box. In the methods for determining the reference voltage and the recommended operating voltage according to the present embodiment, however, even if ambient light is incident into the photodiode array 10, the photodiode array 10 detects the ambient light and outputs the output current counting it. Namely, the ambient light is also reflected in the output current, and it is therefore unnecessary to adopt the configuration for preventing the incidence of ambient light. It is a matter of course that the configuration for preventing the incidence of ambient light can also be adopted in the present embodiment.

Since the aforementioned conventional method for determining the recommended operating voltage requires several thousand repetitive measurements to obtain the frequency distribution, the measurement time becomes long inevitably. However, the present embodiment requires only the measurement of the change of output current against reverse bias voltage (current-voltage characteristic) of the photodiode array 10, and thus the measurement time is extremely short.

The above described the preferred embodiment of the present invention, but it should be noted that the present invention is not always limited only to the above embodiment but can be modified in many ways without departing from the scope and spirit of the invention.

In the present embodiment the inflection points in change of current against reverse bias voltage (current-voltage characteristic) are obtained by the first-order derivative, but the present invention is not limited to this method. Mathematically, the inflection points can also be determined by the second-order derivative. Therefore, the reference voltage may be determined to be the reverse bias voltage at which the second-order derivative of measured current is zero.

In the present embodiment the reference voltage is first determined and then the recommended operating voltage is determined based on the reference voltage, but the present invention is not limited to this method. For example, without determining the reference voltage, the recommended operating voltage may be directly determined from the change of current against reverse bias voltage.

As described above, the recommended operating voltage is preferably set to the reverse bias voltage falling between the inflection point where the largest number of photodiodes D1 move into the Geiger mode and the inflection point due to significant increase of afterpulse and others, in the change of current against reverse bias voltage. Therefore, it is also possible to adopt the following method: after the current-voltage characteristic IV1-IV5 as shown in FIG. 4 is obtained, the recommended operating voltage is determined as the reverse bias voltage in the curve portion between the two inflection points of variation from the downwardly convex state to the upwardly convex state with increase of reverse bias voltage in the current-voltage characteristic IV1-IV5. This also allows us to accurately and readily determine the recommended operating voltage. In this case, the inflection points can also be determined by the first-order derivative or by the second-order derivative.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A reference voltage determining method for determining a reference voltage for determination of a recommended operating voltage of a reverse bias voltage to be applied to a photodiode array, the method comprising:
providing the photodiode array comprising a plurality of avalanche photodiodes operated in Geiger mode and quenching resistors connected in series to the respective avalanche photodiodes, the plurality of avalanche photodiodes being connected in parallel, and
measuring electric current with change of the reverse bias voltage applied to the photodiode array, and determining the reverse bias voltage at an inflection point caused by transition of the largest number of avalanche photodiodes out of the plurality of avalanche photodiodes into the Geiger mode, in change of the electric current measured, as the reference voltage.

2. The reference voltage determining method according to claim 1,
wherein the reverse bias voltage at a peak of the first-order derivative of the electric current measured is determined as the reference voltage.

3. The reference voltage determining method according to claim 1,
wherein the reverse bias voltage at a zero of the second-order derivative of the electric current measured is determined as the reference voltage.

4. A recommended operating voltage determining method for determining a recommended operating voltage of a reverse bias voltage to be applied to a photodiode array, the method comprising:
providing the photodiode array comprising a plurality of avalanche photodiodes operated in Geiger mode and quenching resistors connected in series to the respective avalanche photodiodes, the plurality of avalanche photodiodes being connected in parallel, and
determining a voltage obtained by adding a predetermined value to the reference voltage determined by the reference voltage determining method as set forth in claim 1, as the recommended operating voltage.

5. A recommended operating voltage determining method for determining a recommended operating voltage of a reverse bias voltage to be applied to a photodiode array, the method comprising:

provide the photodiode array comprising a plurality of avalanche photodiodes operated in Geiger mode and quenching resistors connected in series to the respective avalanche photodiodes, the plurality of avalanche photodiodes being connected in parallel, and measuring electric current with change of the reverse bias voltage applied to the photodiode array, and determining the reverse bias voltage in a curve portion between a first inflection point caused by transition of the largest number of avalanche photodiodes out of the plurality of avalanche photodiodes into the Geiger mode and a second inflection point due to significant increase of at least afterpulse, the first and second inflection points being inflection points of variation from a downwardly convex state to an upwardly convex state, in the change of electric current measured, as the recommended operating voltage.

6. A photodiode array comprising:

a plurality of avalanche photodiodes operated in Geiger mode, and quenching resistors connected in series to the respective avalanche photodiodes, the plurality of avalanche photodiodes being connected in parallel, wherein a multiplication factor is set based on the recommended operating voltage determined by the recommended operating voltage determining method as set forth in claim 4.

7. A photodiode array comprising:

a plurality of avalanche photodiodes operated in Geiger mode, and quenching resistors connected in series to the respective avalanche photodiodes, the plurality of avalanche photodiodes being connected in parallel, wherein a multiplication factor is set based on the recommended operating voltage determined by the recommended operating voltage determining method as set forth in claim 5.

* * * * *